(12) United States Patent
Schäfer

(10) Patent No.: US 6,525,977 B2
(45) Date of Patent: Feb. 25, 2003

(54) CIRCUIT CONFIGURATION

(75) Inventor: Andre Schäfer, München (DE)

(73) Assignee: Infineon Technologies AG, München (DE)

(*) Notice: Subject to any disclaimer, the term of this patent is extended or adjusted under 35 U.S.C. 154(b) by 0 days.

(21) Appl. No.: 09/910,749

(22) Filed: Jul. 23, 2001

(65) Prior Publication Data

US 2002/0029369 A1 Mar. 7, 2002

(30) Foreign Application Priority Data

Jul. 21, 2000 (DE) .......................... 100 35 636

(51) Int. Cl.[7] ................................. G11C 7/02
(52) U.S. Cl. .......................... 365/206; 365/45
(58) Field of Search ................. 365/206, 45, 51, 365/52, 63, 149

(56) References Cited

U.S. PATENT DOCUMENTS 6,359,897 B1 * 3/2002 Hessel et al. .......... 365/230.03

2002/0009000 A1 * 1/2002 Goldberg et al. .......... 365/200

FOREIGN PATENT DOCUMENTS

| DE | 31 30 341 A1 | 6/1982 |
| EP | 0 581 477 A1 | 2/1994 |

* cited by examiner

Primary Examiner—Richard Elms
Assistant Examiner—Anh Phung
(74) Attorney, Agent, or Firm—Laurence A. Greenberg; Werner H. Stemer; Gregory L. Mayback

(57) ABSTRACT

A circuit configuration prevents a transfer of interference signals present on an input line to a processing section. Electrical input signals are evaluated in an analysis circuit which is connected in parallel with the actual reception circuit in a protection device. If an interference signal is present, a transfer circuit is controlled such that a transfer to the processing section is prevented.

16 Claims, 2 Drawing Sheets

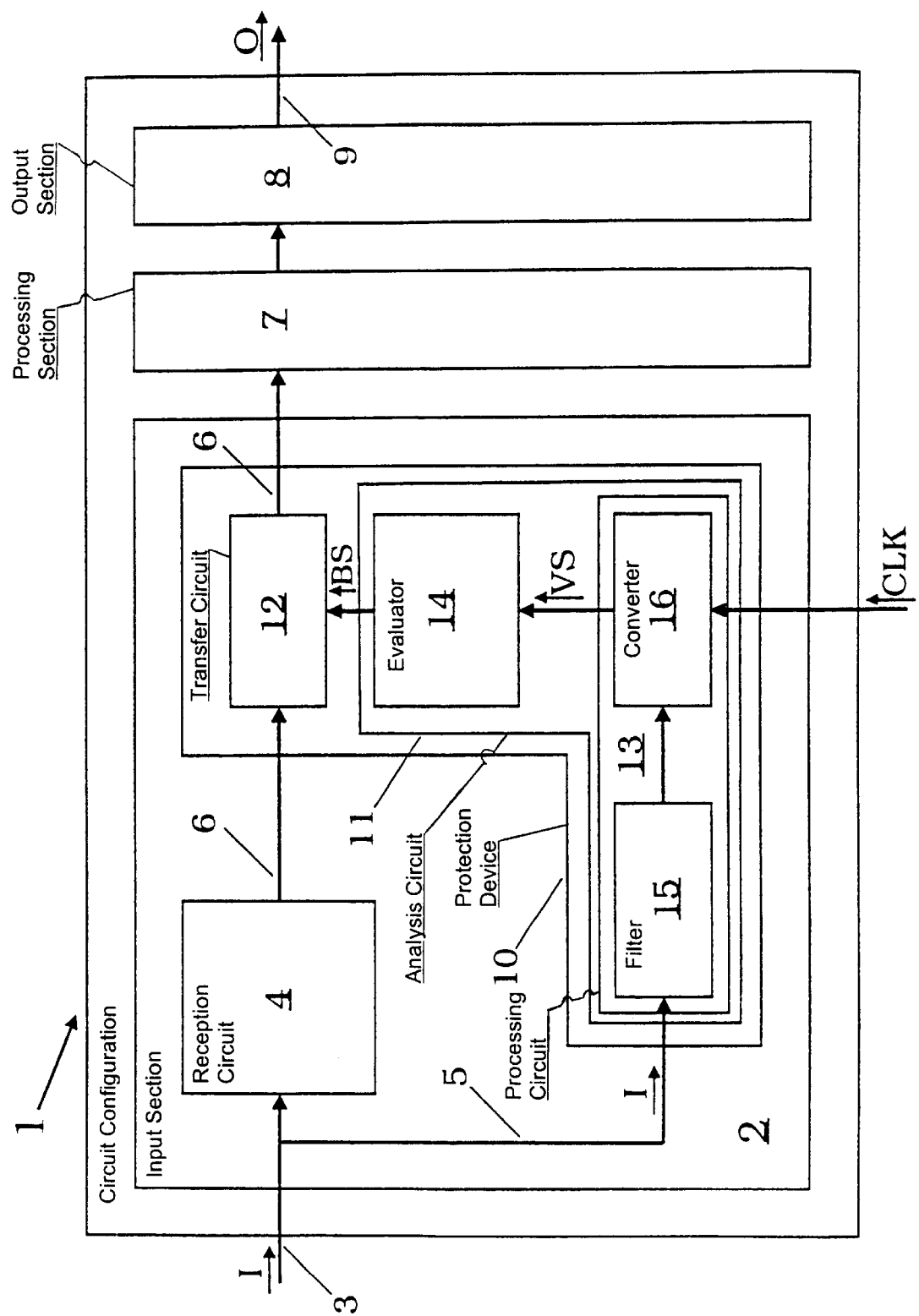
Fig_1

CIRCUIT CONFIGURATION

BACKGROUND OF THE INVENTION

Field of the Invention

The invention relates to a circuit configuration in particular a semiconductor circuit configuration, with a protection device that analyzes interference signals in electrical input signals.

In many electrical systems and circuit configurations, specific signals are output by parts of the system, for example by drivers, and are made available and transferred to other parts of the system, such as receivers. What is problematic in such electrical systems, circuit configurations, in particular semiconductor circuit configurations, memory devices, DRAM elements or the like is that in many cases the actual signals that are to be received and further processed have an interference superposed on them, in particular in the form of interference signal spikes, which, on external data/command lines, can lead to malfunctions in the course of reading and/or further processing of the corresponding information. This applies to integrated circuits of all kinds.

In order to avoid these undesirable influences and associated malfunctions, in conventional circuit configurations filter devices are provided in the input section, which are intended to filter out and/or separate the corresponding interference signal spikes. This is achieved by correspondingly restricting the bandwidth of the electrical input signal. The filter circuits provided for this purpose take up an appreciable space in conventional circuit configurations. Moreover, the filter devices provided increase the transient recovery time of the actual receiver circuit in the input section of the circuit configuration. This leads to a poor performance of the entire circuit configuration.

SUMMARY OF THE INVENTION

It is accordingly an object of the invention to provide a circuit configuration, in particular semiconductor circuit configuration, memory device, DRAM element or the like, which overcomes the above-mentioned disadvantages of the heretofore-known circuit configurations of this general type and in which the ingress and the transfer of an interference signal present in the input section of the circuit configuration can be suppressed using particularly space-saving devices and nonetheless reliably.

With the foregoing and other objects in view there is provided, in accordance with the invention, a circuit configuration, including:

a processing section;

an input section operatively connected to the processing section, the input section being configured to at least receive an electrical input signal fed to the input section and to transfer the electrical input signal to the processing section, the input section including a reception circuit, an input line device, and a transfer line device connected to the processing section;

a protection device formed in the transfer line device, the protection device including a processing circuit with a filter device and a frequency converter connected downstream of the filter device;

a feed line device connected to the protection device, the feed line device being at least configured to feed the electrical input signal from the input line device to the protection device;

the protection device being configured to analyze the electrical input signal with regard to interference signals present in the electrical input signal;

the filter device being configured to split off a given high-frequency component from the electrical input signal and to provide the given high-frequency component as a processing signal;

the frequency converter being configured to transform the given high-frequency component of the electrical input signal into at least one frequency range selected from the group consisting of a low-frequency range and an intermediate frequency band; and the protection device being configured to prevent a transferring of the electrical input signal from the input section via the transfer line device to the processing section when interference signals are present in the electrical input signal.

In other words, according to the invention, the circuit configuration, in particular semiconductor circuit configuration, memory device, DRAM element or the like includes:

an input section, which is configured at least for receiving an electrical input signal that is fed in and for forwarding it to a processing section and which has, to that end, an input line device and also a reception circuit and a transfer line device toward the processing section;

a protection device formed in the transfer line device;

a feed line device, by which at least the electrical input signal can be fed to the protection device from the input line device, the protection device being able to analyze the electrical input signal with regard to interference signals contained therein; and a processing circuit having a filter device, by which filter device a predetermined high-frequency component, in particular an RF component, can be split off from the electrical input signal and can be provided as a processing signal, in particular to an evaluation circuit, the processing circuit has a frequency converter or the like, the frequency converter is connected downstream of the filter device, through the use of the frequency converter a high-frequency component of the electrical input signal can be transformed, preferably shifted, into a low-frequency range, and/or into an intermediate frequency band, and when there are interference signals present in the electrical input signal, the protection device can prevent the transfer of the electrical input signal from the input section via the transfer line device to the processing section.

A generic circuit configuration, in particular semiconductor circuit configuration, memory device, DRAM element or the like, has an input section, which is configured at least for receiving an electrical input signal that is fed in and for forwarding it to a processing section provided in the circuit configuration and which has, to that end, an input line device and also a reception circuit and a transfer line device toward the processing section.

In the case of the circuit configuration according to the invention, a protection device is provided in the transfer line device. Furthermore, a feed line device is provided, by which at least the electrical input signal can be fed to the protection device from the input line device. According to the invention, the protection device is configured to analyze the electrical input signal with regard to interference signals contained therein and, when there are interference signals present in the electrical input signal, to prevent the transfer of the electrical input signal from the input section via the transfer line device toward the processing section.

A basic idea of the present invention is that, instead of a filter device formed in series with the reception circuit, preferably upstream thereof, a protection device is formed essentially in parallel therewith, in which protection device the electrical input signal can be analyzed with regard to possible interference signals. If there is an interference signal present in the electrical input signal and if it is evaluated as relevant, then the electrical input signal is prevented from being transferred from the input section via the transfer line device toward the processing section. Consequently, by virtue of the configuration according to the invention, space-consuming and complicated electronic filter elements are avoided in the circuit configuration and the input circuit is not delayed in terms of its response behavior and transient recovery behavior.

In order to realize the parallel processing of the electrical input signal, a preferred embodiment of the circuit configuration according to the invention provides for the protection device to have an analysis circuit, which is configured for analyzing the electrical input signal in parallel with the input circuit, and a transfer circuit, which is configured for the controllable transfer of the electrical input signal to the processing section in the transfer line device.

This means that the transfer circuit is formed in series between the reception circuit and the processing section in the transfer line device. For its part, the transfer circuit operates for example essentially as a switch which regulates the transmission or blocking of the electrical input signal present from the reception circuit toward the processing section. This switching mechanism is controlled in the transfer circuit by an analysis circuit which is formed in parallel with the input line device and with the transfer line device, and which receives, processes and evaluates the electrical input signal in parallel with the reception circuit and then controls and switches the series-connected transfer circuit in the transfer circuit device in a manner dependent on the analysis or processing result.

A further preferred embodiment of the circuit configuration according to the invention provides for the protection device and, in particular, the analysis circuit to have a processing circuit, which is configured for processing the electrical input signal, and an evaluation circuit, which is configured for comparing the electrical input signal, a part thereof and/or a signal derived therefrom and/or for forming a decision with regard to the forwarding of the electrical input signal from the reception circuit to the processing section, the comparison being able to be carried out on the basis of predetermined comparison signals. The processing of the electrical input signal and its evaluation are functionally separated by virtue of this measure. On the one hand, the electrical input signal, parts thereof or else signals derived therefrom are processed and then forwarded as so-called processing signals to the evaluation circuit. This evaluation circuit then carries out the actual comparison with regard to specific specifications, i.e. with regard to comparison signals.

In this case, the processing circuit can be limited to processing specific signal components, in the case of which interference signal components are particularly problematic, or else encompass the entire signal. Furthermore, it is also possible to consider specific filtered components or transformed, for example Fourier-transformed, and/or spectral components or the like.

It is particularly advantageous that an evaluation signal having a first control value can be generated by the evaluation circuit and can be fed to the transfer circuit, which signal causes the transfer circuit to transfer an electrical input signal to the processing section if the evaluation circuit ascertains that the electrical input signal has essentially no signal interference.

On the other hand, it is also advantageous that an evaluation signal having a second control value can be generated by the evaluation circuit and can be fed to the transfer circuit, which signal can cause the transfer circuit not to transfer an electrical input signal to the processing section if the evaluation circuit ascertains that the electrical input signal essentially has signal interference.

These two last-mentioned measures essentially have the aim of generating an evaluation signal as control signal for the transfer circuit. This evaluation signal may advantageously assume two different control values corresponding, for example, to a logic "0" or "1". If the evaluation signal is allocated the first control value, i.e. for example the logic "0", then this means that the electrical input signal contains essentially no interference signal. This then leads to forwarding of the electrical input signal from the reception circuit to the processing section. By contrast, if the evaluation signal is allocated the second control value, namely for example the logic "1", then this means that the electrical input signal essentially has signal interference. In that case, the transfer of the electrical input signal from the reception circuit to the processing section is not permitted or is prevented.

Different kinds of criteria can be used for making a decision with regard to the presence of an interference signal in the electrical input signal. By way of example, the input signal can be compared with a normalized input signal. This comparison can be effected pointwise over the entire temporal profile of the electrical input signal, deviations— whether weighted or not—being summed in some form and functionally processed to give an evaluation signal. However, a more complex integral transformation in the sense of convolution or the like is also conceivable, in which case special forms of metrics or other statistical parameters or variables can also be used as comparison criterion.

A further preferred embodiment of the circuit configuration according to the invention provides for the processing circuit to be configured for processing at least one high-frequency component and/or RF component of the electrical input signal. This exploits the fact that signal interference in circuit configurations often occurs momentarily as so-called interference signal spikes. The momentary nature of these interference signal spikes results in a broadband nature of the signal spectrum in the frequency domain, i.e. when considering the Fourier transform of the electrical input signal. This means that the Fourier-transformed electrical input signal has critical amplitudes on account of the interference signal components in all frequency ranges, in particular including the RF or high-frequency ranges. By processing exactly these high-frequency or RF components, it is possible to search for characteristic features in the high-frequency range which would not be present without an interference signal component in the electrical input signal. Consequently, it is possible to ascertain in a simple manner, just by analyzing the high-frequency component or the RF component, whether interference signal spikes were present in the input signal.

In order to subject this high-frequency component or RF component of the electrical input signal to more precise consideration, a preferred embodiment of the circuit configuration according to the invention provides a corresponding filter device by which a specific, that is to say in particular a high-frequency or RF component can be split off from the electrical input signal and can be made available as processing signal, in particular directly to the evaluation circuit.

This construction fundamentally presupposes that the evaluation circuit is able to process high-frequency or RF components as such, to supply them for comparison and to evaluate them.

It is often the case, however, that the evaluation in the high-frequency or RF range is also complex in terms of circuitry, so that processing in the intermediate frequency band or in the range of lower frequencies is desirable. To that end, a further preferred embodiment of the circuit configuration according to the invention provides a frequency converter (mixer) or the like which is connected downstream of the filter device, in particular essentially in series, and by which an, in particular high-frequency, frequency component of the electrical input signal can be transformed, preferably shifted, into a low-frequency range or into an intermediate frequency band range. The effect achieved as a result is that, after "cutting out" the frequency ranges in the RF band that are critical for characterizing the interference signal spikes, the frequency ranges are shifted into a lower frequency band, namely that of the intermediate frequency band, for the purpose of more convenient, simplified analysis.

Operating a frequency converter, mixer or the like fundamentally requires a specific processing frequency. It is particular advantageous if the characteristic frequency of the frequency converter is precisely the frequency of a harmonic or fundamental frequency of a large signal that is fed to the circuit configuration or one that is present there. In this case, a clock or operating frequency that is present in the circuit configuration or is fed thereto is preferably used as the large signal.

Through the use of the procedure according to the invention, it is possible for example to examine an interference signal spike with frequency components in the GHz range by conversion in the frequency converter or mixer in the range of a few hundred MHz in a particularly simple, fast and nonetheless reliable manner, in order to generate an evaluation signal for controlling the transfer circuit.

Other features which are considered as characteristic for the invention are set forth in the appended claims.

Although the invention is illustrated and described herein as embodied in a circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic block diagram of an embodiment of the circuit configuration according to the invention.

DESCRIPTION OF THE PREFERRED EMBODIMENTS

Figure 2A:
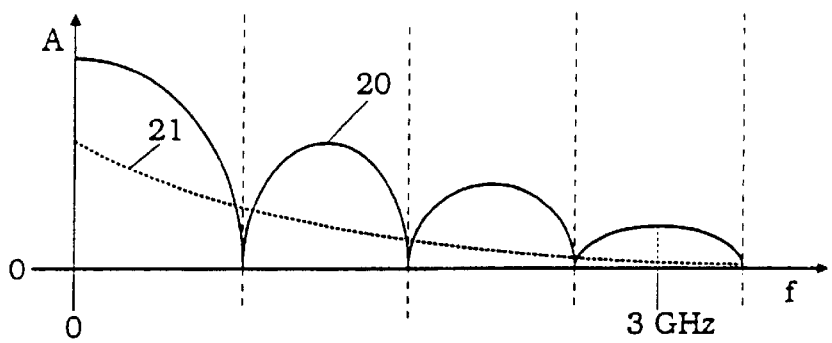
FIGS. 2A–D are graphs for illustrating various stages of the signal processing when using an embodiment of the circuit configuration according to the invention.

Referring now to the figures of the drawings in detail and first, particularly, to FIG. 1 thereof, there is shown, in the form of a schematic block diagram, the structure of an exemplary embodiment of the circuit configuration 1 according to the invention.

The circuit configuration 1 according to the invention has an input line device 3, via which an electrical input signal I is made available, and also an output line device 9, via which the corresponding output signal O is made available. The electrical input signal I is firstly fed to the input section 2 via the input line device 3. Afterward, the electrical input signal I, if appropriate after intermediate processing by the reception circuit 4, is forwarded via a transfer line device 6 to the actual processing section 7 and finally to the output section 8.

In parallel with the input line device 3 and partly with the transfer line device 6, according to the invention a protection device 10 is formed in the input section 2, which protection device has a transfer circuit 12 and also an analysis circuit 11. Via a feed line device 5 connected to the input line device 3, the analysis circuit 11 likewise receives the electrical input signal I as input, thereupon carries out an analysis of the electrical input signal I and generates an evaluation signal BS as analysis result, which evaluation signal is fed to the transfer device 12 as a control or switching signal in order to control the transfer operation in the transfer device 12, namely of the electrical input signal I from the reception circuit 4 via the transfer line device 6 toward the processing section 7.

The analysis circuit 11 has an evaluation circuit 14, which carries out the actual evaluation of the electrical input signal I and a corresponding comparison with predetermined normalized signals and generates and makes available the corresponding evaluation signal BS as evaluation result. To that end, a processed or processing signal VS is fed to the evaluation circuit 14 from the processing circuit 13. In the exemplary embodiment of the circuit configuration according to the invention as shown in FIG. 1, the processing circuit 13 is formed by a frequency converter 16 and a filter device 15 connected in series upstream thereof. The filter device 15 firstly cuts a characteristic frequency range out from the entire electrical input signal I and then shifts it into a low-frequency range or into an intermediate frequency band for the purpose of better processing. The interaction of the filter device 15 with the frequency converter 16 gives rise to the corresponding processing signal VS, which is fed to the evaluation circuit 14 for evaluation and for comparison.

The mode of operation of the frequency converter 16 is in this case based on a clock signal CLK fed via a line device 17. This may, for example, also be the processing clock signal generated in a microprocessor.

FIGS. 2A to 2D shows graphs in each of which the signal amplitudes A are plotted as a function of the signal frequency f. The four graphs of FIGS. 2A to 2D show various processing stages which are reached in the context of the analysis in the analysis circuit 11 of the circuit configuration 1 according to the invention.

In the graph of FIG. 2A, the trace or curve 20 shows the so-called useful signal which is contained in the electrical input signal I and which represents a kind of ideal form of the electrical input signal I without interference. By contrast, the trace 21 shows the unadulterated interference component in the electrical input signal I that is actually present.

Figure 2B:
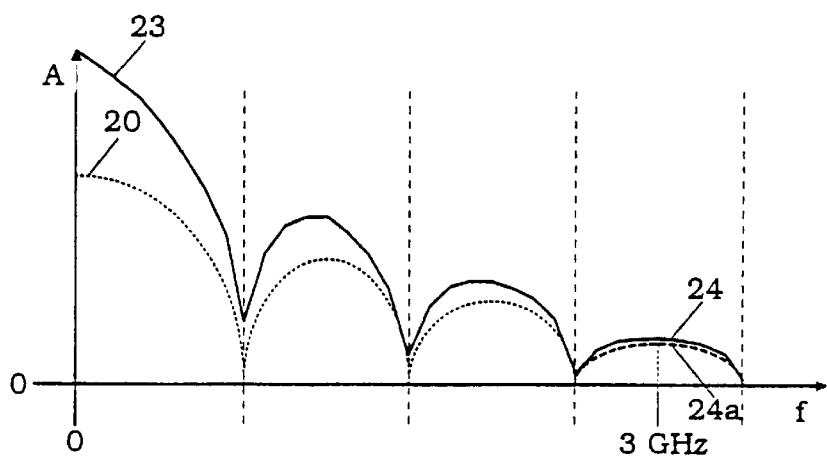

The graph of FIG. 2B shows, in trace 23, the real electrical input signal I as superposition of the traces 20 and 21, namely of the useful signal 20 with the interference signal component 21, from FIG. 2A. The trace 20 from FIG. 2A, namely the unadulterated useful signal in the electrical input signal I, is represented by a broken line.

Through the application of a filter process imparted by the filter device 15, the critical or relevant frequency range is cut out from the superposition signal 23 or the electrical input signal I, so that only the portion 24 of the trace 23 remains after application of the filter 15. The portion is e.g. at a center frequency of about 3 GHz. For comparison, the unadulterated useful signal component of the trace 20 is again represented in the form of a broken line. The portion 24a shows the RF component of the electrical input signal when there is no interference present.

Figure 2C:
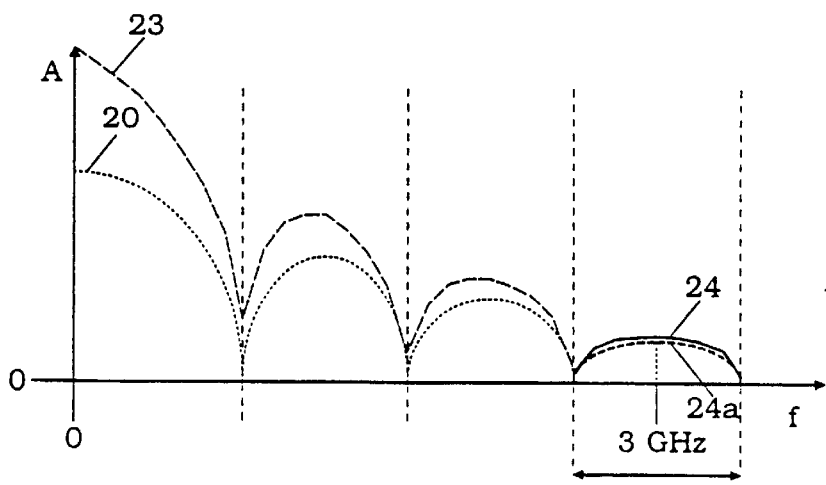
Figure 2D:
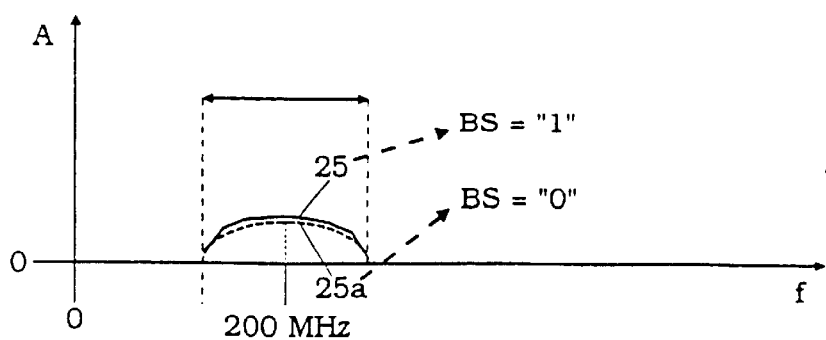

Finally, FIG. 2D shows the result of the application of the frequency converter 16 to the separated signal components 24 and 24a from FIG. 2C. After application of the frequency converter 16, the traces 25 and 25a are obtained as a result, the traces corresponding to the traces 24 and 24a from FIG. 2C when they are shifted e.g. to a frequency range with a center frequency of about 200 MHz. The horizontal arrows in FIGS. 2C and 2D indicate respective frequency ranges before and after being shifted.

Through evaluation by application of the evaluation circuit 14 to the cut-out and transformed-down or down-shifted signal component 25, an evaluation signal BS having the value "1" would be generated, because an interference signal component of a relevant kind is present in this case. By contrast, an evaluation signal BS=0 would be generated in the case of the component 25a, namely the useful component without interference, which would then result in the electrical input signal I being transferred from the reception circuit 4 via the transfer line device 6 to the processing section 7.

The procedure according to the invention departs from the conventional route of limiting the bandwidth of an input signal through the use of filter circuits. The conventional route requires more space in the circuit configuration and, if appropriate, furthermore increases the transient recovery time of the input section of the circuit configuration. This is prevented in the case of the parallel circuit configuration with the corresponding protection device, which can also be referred to as parallel detector circuit.

The method of operation according to the invention essentially is performed in that higher-frequency components of an interference signal are converted in an intermediate frequency band range through the use of a mixer, the interference signal component is down-converted to the harmonic of a large signal, in particular of a system clock signal. In this case, the signal produced in the low-frequency range is compared with the expected value of a standard signal in this range, and, in a decision circuit or evaluation circuit, a corresponding control signal is generated and made available for a transfer circuit, which essentially functions as a switch.

I claim:

1. A circuit configuration, comprising:
   a processing section;
   an input section operatively connected to said processing section, said input section being configured to at least receive an electrical input signal fed to said input section and to transfer the electrical input signal to said processing section, said input section including a reception circuit, an input line device, and a transfer line device connected to said processing section;
   a protection device formed in said transfer line device, said protection device including a processing circuit with a filter device and a frequency converter connected downstream of said filter device;
   a feed line device connected to said protection device, said feed line device being at least configured to feed the electrical input signal from said input line device to said protection device;
   said protection device being configured to analyze the electrical input signal with regard to interference signals present in the electrical input signal;
   said filter device being configured to split off a given high-frequency component from the electrical input signal and to provide the given high-frequency component as a processing signal;
   said frequency converter being configured to transform the given high-frequency component of the electrical input signal into at least one frequency range selected from the group consisting of a low-frequency range and an intermediate frequency band; and
   said protection device being configured to prevent a transferring of the electrical input signal from said input section via said transfer line device to said processing section when interference signals are present in the electrical input signal.

2. The circuit configuration according to claim 1, wherein said filter device is configured to split off an RF component, as the given high-frequency component, from the electrical input signal.

3. The circuit configuration according to claim 1, including an evaluation circuit operatively connected to said processing circuit, said evaluation circuit receiving the processing signal.

4. The circuit configuration according to claim 1, wherein said frequency converter is configured to transform the given high-frequency component of the electrical input signal by shifting the given high-frequency component into at least one frequency range selected from the group consisting of a low-frequency range and an intermediate frequency band.

5. The circuit configuration according to claim 1, wherein:
   said protection device includes an analysis circuit and a transfer circuit;
   said analysis circuit is provided in parallel to said reception circuit and includes said processing circuit, and said analysis circuit is configured to analyze the electrical input signal; and
   said transfer circuit is provided in said transfer line device and controls a transfer of the electrical input signal to said processing section.

6. The circuit configuration according to claim 1, wherein:
   said processing circuit is configured to process the electrical input signal; and
   said protection device includes an evaluation circuit configured to compare a signal selected from the group consisting of the electrical input signal, a portion of the electrical input signal and a signal derived from the electrical input signal with given comparison signals.

7. The circuit configuration according to claim 6, wherein:
   said protection device includes a transfer circuit provided in said transfer line device for controlling a transfer of the electrical input signal to said processing section;
   said evaluation circuit generates an evaluation signal having a given control value, and said evaluation circuit feeds the evaluation signal to said transfer circuit; and
   said transfer circuit, in dependence of the evaluation signal, transfers the electrical input signal to said processing section if said evaluation circuit ascertains that the electrical input signal has substantially no signal interference.

8. The circuit configuration according to claim 6, wherein:

said protection device includes a transfer circuit provided in said transfer line device for controlling a transfer of the electrical input signal to said processing section;

said evaluation circuit generates an evaluation signal having a given control value, and said evaluation circuit feeds the evaluation signal to said transfer circuit; and said transfer circuit, in dependence of the evaluation signal, does not transfer the electrical input signal to said processing section if said evaluation circuit ascertains that the electrical input signal has a signal interference.

9. The circuit configuration according to claim 6, wherein said processing circuit is configured to process at least one component of the electrical input signal selected from the group consisting of a high-frequency component and an RF component.

10. The circuit configuration according to claim 1, wherein:

said processing circuit is configured to process the electrical input signal; and said protection device includes an evaluation circuit configured to provide a decision with regard to forwarding the electrical input signal from said reception circuit to said processing section.

11. The circuit configuration according to claim 1, wherein:

said processing circuit is configured to process the electrical input signal; and said protection device includes an evaluation circuit configured to compare a signal selected from the group consisting of the electrical input signal, a portion of the electrical input signal and a signal derived from the electrical input signal with given comparison signals, and said evaluation circuit provides a decision with regard to forwarding the electrical input signal from said reception circuit to said processing section.

12. The circuit configuration according to claim 1, wherein said frequency converter has a characteristic frequency corresponding to one of a harmonic frequency and a fundamental frequency of a large signal provided at said input section.

13. The circuit configuration according to claim 1, wherein said frequency converter has a characteristic frequency corresponding to one of a harmonic frequency and a fundamental frequency of a signal selected from the group consisting of a clock signal and an operating signal provided at said input section.

14. The circuit configuration according to claim 1, wherein said input section and said protection device are elements in a semiconductor circuit configuration.

15. The circuit configuration according to claim 1, wherein said input section and said protection device are elements in a memory device.

16. The circuit configuration according to claim 1, wherein said input section and said protection device are elements in a DRAM.

* * * * *